United States Patent
Takagi et al.

(10) Patent No.: US 7,473,987 B2
(45) Date of Patent: Jan. 6, 2009

(54) SEMICONDUCTOR DEVICE

(75) Inventors: Shingo Takagi, Kawasaki (JP); Shuichi Takada, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 283 days.

(21) Appl. No.: 11/398,352

(22) Filed: Apr. 4, 2006

(65) Prior Publication Data
US 2006/0262596 A1 Nov. 23, 2006

(30) Foreign Application Priority Data
Apr. 20, 2005 (JP) ............... 2005-122120

(51) Int. Cl.
*H01L 23/48* (2006.01)
(52) U.S. Cl. ..................... 257/668; 257/666
(58) Field of Classification Search ............... 257/666, 257/668, 671
See application file for complete search history.

(56) References Cited

U.S. PATENT DOCUMENTS 5,955,889 A 9/1999 Taguchi et al.
6,487,250 B1 11/2002 Kato et al.
6,835,586 B2 * 12/2004 Yamazaki et al. ............. 438/48
6,898,096 B2 * 5/2005 Endo et al. .................. 363/147
2002/0163063 A1 * 11/2002 Noguchi et al. ............. 257/666

FOREIGN PATENT DOCUMENTS

JP 2004-015036 1/2004

* cited by examiner

*Primary Examiner*—Phuc T Dang
(74) *Attorney, Agent, or Firm*—DLA Piper LLP (US)

(57) ABSTRACT

According to the present invention, there is provided a semiconductor device comprising:
  a current driver which is connected to a power supply terminal, and supplies a predetermined current;
  a first wiring layer which is connected to an output terminal of said current driver; and
  a second wiring layer which is placed to oppose said first wiring layer via an insulating layer, and has a predetermined resistance value.

8 Claims, 6 Drawing Sheets

SEMICONDUCTOR DEVICE

CROSS REFERENCE TO RELATED APPLICATION

This application is based upon and claims benefit of priority under 35 USC §119 from the Japanese Patent Application No. 2005-122120, filed on Apr. 20, 2005, the entire contents of which are incorporated herein by reference.

BACKGROUND OF THE INVENTION

The present invention relates to a semiconductor device and, more particularly, to a semiconductor device which is suitable to have a current driver.

In a communication system, when a high-speed signal is to be transmitted from a transmitting side to a receiving side, the signal must have a waveform which satisfies a predetermined standard on the receiving side. In order to implement a high-quality waveform, the output waveform of the current driver must be controlled on the transmitting side.

However, since the current driver on the transmitting side is required to have a large driving capability to flow a large current, a wiring line on the output side of the current driver must be wide. The wiring line having a large area increases a parasitic capacitance.

Because of the presence of such parasitic capacitance, a filter is equivalently formed. Accordingly, an output signal waveform may be unintentionally distorted, and the waveform may not satisfy the standard on the receiving side. Conventionally, it is difficult to control such waveform distortion.

A reference which discloses a technique for the output waveform of a conventional current driver is as follows:
Japanese Patent Laid-Open No. 2004-15036

SUMMARY OF THE INVENTION

According to one aspect of the invention, there is provided a semiconductor device comprising:
a current driver which is connected to a power supply terminal, and supplies a predetermined current;
a first wiring layer which is connected to an output terminal of said current driver; and
a second wiring layer which is placed to oppose said first wiring layer via an insulating layer, and has a predetermined resistance value.

According to one aspect of the invention, there is provided a semiconductor device comprising:
a current driver which is connected to a power supply terminal, and supplies a predetermined current;
a first wiring layer which is connected to an output terminal of said current driver;
a plurality of wells each of which opposes said first wiring layer via an insulating film in an upper surface portion of a semiconductor substrate, has a predetermined resistance value, and has a grounded end portion;
a plurality of switch elements formed in an upper surface portion of said well to switch an ON/OFF state between the grounded end portion and a portion opposing said first wiring layer; and
a switching control unit which controls an ON/OFF state of said switch element.

According to one aspect of the invention, there is provided a semiconductor device comprising:
a current driver which is connected to a power supply terminal, and supplies a predetermined current;
a first wiring layer which is connected to an output terminal of said current driver;
a semiconductor chip which is arranged to oppose said first wiring layer via an insulating film, and has a second wiring layer whose one end portion is connected to an external terminal; and
a resistance element connected between the external terminal and a ground terminal outside said semiconductor chip.

DESCRIPTION OF THE EMBODIMENTS

Figure 1:
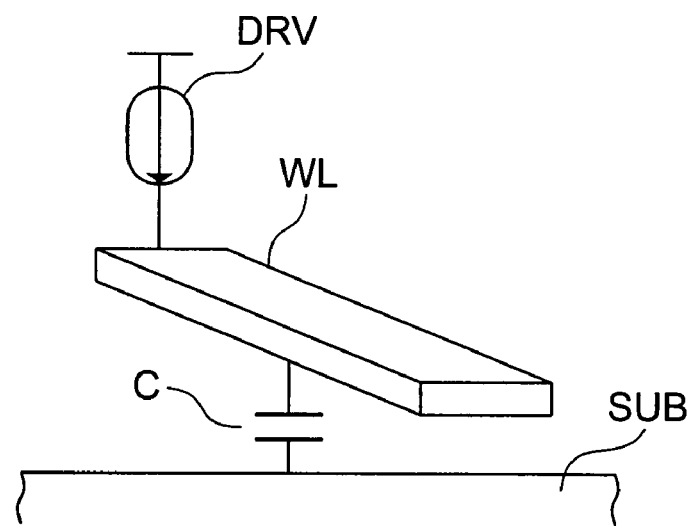
FIG. 1 is a perspective view showing the arrangement of a semiconductor device according to a reference example.

FIG. 1 shows the arrangement of a semiconductor device as a reference example.

A terminal on the power supply side of a current driver DRV is connected to a power supply terminal to supply a power supply voltage. A signal is input from a circuit side (not shown), and an output terminal is connected to a wiring line WL. An output signal from the current driver DRV is transferred to a receiving side (not shown) via the wiring line WL.

However, the wiring line WL is formed above a semiconductor substrate SUB, and an insulating film (not shown) and a parasitic capacitance C are formed between the wiring line WL and the semiconductor substrate SUB.

Figure 2:
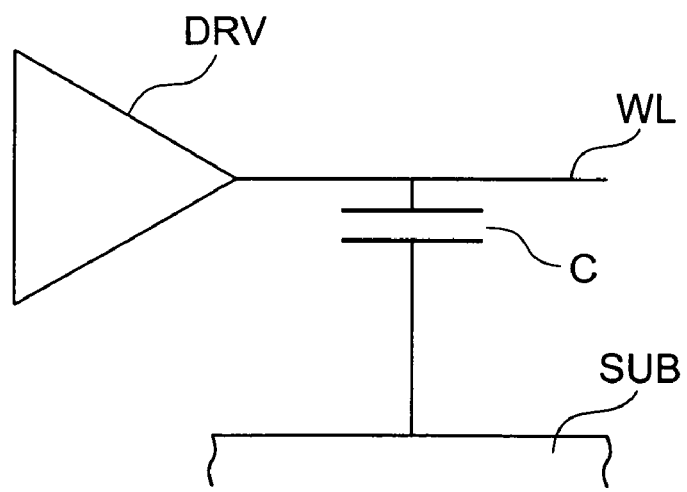
FIG. 2 is a circuit diagram showing the arrangement of an equivalent circuit of the semiconductor device.

Such arrangement having the current driver DRV, wiring line WL, capacitance C, and semiconductor substrate SUB is shown in FIG. 2 as an equivalent circuit.

In this arrangement, even when the output waveform of the current driver DRV is distorted by the parasitic capacitance C, a waveform quality cannot be improved. Hence, the output signal waveform may not satisfy a standard on the receiving side.

To cope with this problem, as will be described later, the semiconductor device according to the embodiments of the present invention can control the output waveform on the transmitting side to satisfy the standard on the receiving side.

(1) First Embodiment

Figure 3:
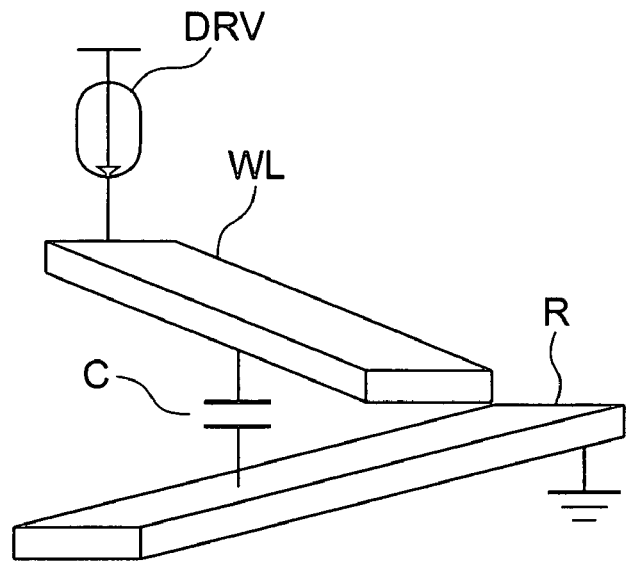
FIG. 3 is a perspective view showing the arrangement of a semiconductor device according to the first embodiment of the present invention.
Figure 4:
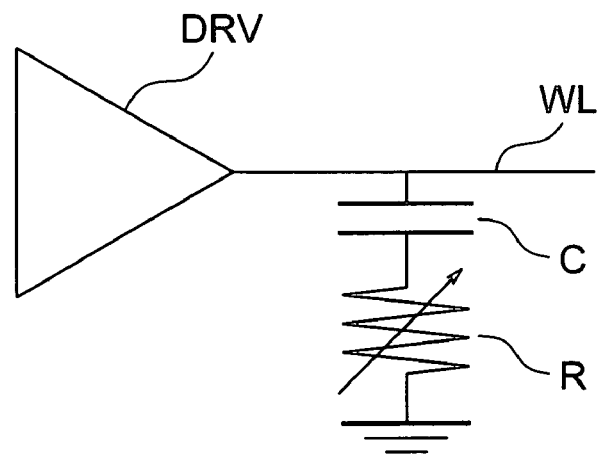
FIG. 4 is a circuit diagram showing the arrangement of an equivalent circuit of the semiconductor device.

FIG. 3 shows the arrangement of a semiconductor device according to the first embodiment of the present invention, and FIG. 4 shows the arrangement of an equivalent circuit in this arrangement.

A terminal on the power supply side of a current driver DRV is connected to a power supply terminal to supply a power supply voltage. A signal is input from a circuit side (not shown), and an output terminal is connected to a wiring line WL.

A ground resistance layer R made of, e.g., polysilicon is formed below the wiring line WL to oppose each other via an insulating film (not shown). In this arrangement, a parasitic capacitance C is formed between the wiring line WL and the resistance layer R.

The resistance layer R has a predetermined resistance value. As a variable resistance in the equivalent circuit diagram of FIG. 4, the resistance layer R can obtain a desired resistance value by changing the width, length, thickness, and material of the wiring line.

As described above, in the first embodiment, the resistance layer R is placed, via the insulating film, below the wiring layer WL connected to the output terminal of the current driver DRV. As a result, as shown in the equivalent circuit diagram of FIG. 4, the parasitic capacitance C between the wiring layer WL and the resistance layer R, and the resistance of the resistance layer R form a high-pass filter connected in series between the wiring layer WL and a ground terminal.

Upon controlling the resistance value of the resistance layer R, the characteristics of the high-pass filter can be arbitrarily set, and the rise/fall time of the output waveform of the current driver DRV can also be controlled.

In this manner, according to the first embodiment, the parasitic capacitance of the wide wiring line WL connected to the output terminal of the current driver DRV is used to form the high-pass filter, and to control the resistance value of this high-pass filter. This makes it possible to control the waveform to have a desired shape so as to satisfy a standard on the receiving side of a high-frequency signal.

In a communication system in which a high-frequency signal is transmitted and received, a phenomenon such as reflection, ringing, or attenuation occurs at an impedance mismatch point when a slew rate is excessively high. To cope with this problem, the slew rate is decreased, i.e., the rise/fall time slows down to reduce the high-frequency component. With this operation, such phenomenon can be-prevented, and the standard on the receiving side can be satisfied.

In the first embodiment, a new resistance layer R must be arranged on the output side of the current driver DRV. However, since the current driver DRV is required to have a large driving capability, its element area is large. Hence, almost no disadvantage pertaining to the area is caused in terms of the resistance layer R arranged on the output side of the current driver DRV.

Note that the longitudinal directions of the wiring layer WL and the resistance layer R in FIG. 3 do not coincide with each other, i.e., the wiring layer WL and the resistance layer R are arranged to make a relatively constant angle. When their longitudinal directions coincide with each other, the parasitic capacitance C between them may become too large. Hence, these layers are desirably placed to make a given angle to obtain a desired capacitance.

(2) Second Embodiment

Figure 5:
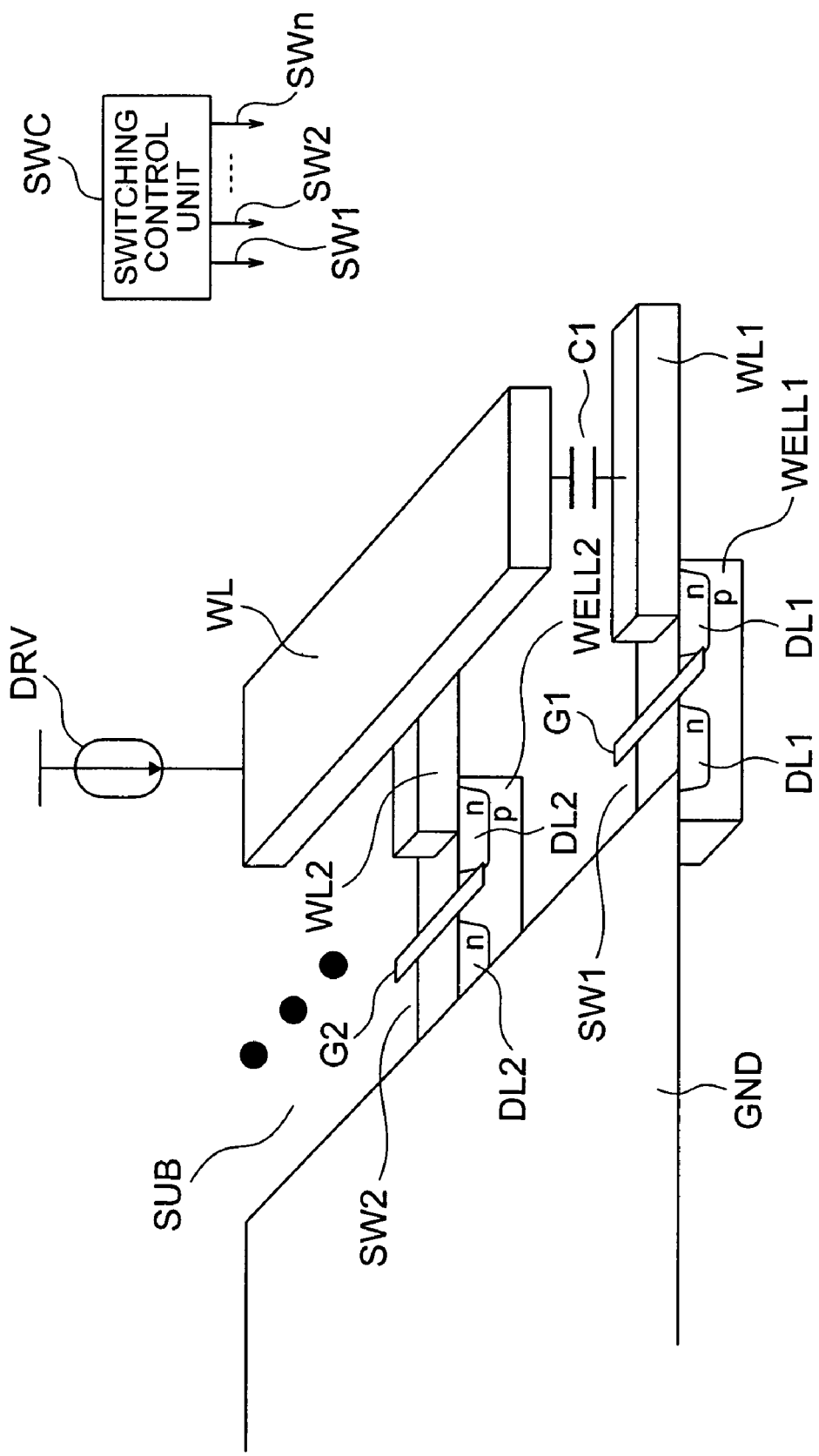
FIG. 5 is a perspective view showing the arrangement of a semiconductor device according to the second embodiment of the present invention.

The second embodiment of the present invention will be described with reference to FIG. 5 which shows its arrangement. In this case, an equivalent circuit is the same as that shown in FIG. 4 in the first embodiment.

In the second embodiment, the resistance layer in the first embodiment is replaced with a wiring layer and a MOSFET connected to the wiring layer.

A ground wiring line GND is formed on a semiconductor substrate SUB, and a plurality of first wiring layers WL1, WL2, . . . are arranged at predetermined intervals in a direction perpendicular to one end face of the ground wiring line GND to oppose each other. Between the wiring layer WL1 and the ground wiring line GND, a switch SW1 comprising a MOSFET is provided. The MOSFET includes a gate electrode G1 which is formed on the semiconductor substrate SUB via a gate insulating film (not shown), and impurity diffusion layers DL1 which serve as a source and drain formed in the upper surface portion of a well WELL1 formed in the upper surface portion of the semiconductor substrate SUB. Similarly, a switch SW2 comprising a MOSFET which includes impurity diffusion layers DL2 is arranged between the wiring layer WL2 and the ground wiring line GND. In this case, n (n is an integer equal to or more than 2) sets of such structures are provided.

Note that one end portion of each of the wells WELL1, WELL2, . . . is electrically connected to the ground wiring line GND.

The switches SW1, SW2, . . . can be turned on/off in accordance with control signals SW1, SW2, . . . respectively input to the gate electrode G1, and electrodes G2, . . . in the MOSFETs. Of the plurality of switches SW1, SW2, . . . , one or more desired switches SWj (j is an integer between 1 and n (both inclusive)) are selectively turned on. Accordingly, a wiring layer WLj connected to the ON switch SWj is connected to a ground layer GND via an ON resistance.

A second wiring layer WL whose longitudinal direction is perpendicular to the plurality of first wiring layers WL1, WL2, . . . is placed above them via an insulating layer (not shown). The second wiring layer WL is connected to the output terminal of a current driver DRV.

As described above, in the second embodiment, the plurality of first wiring layers WL1, WL2, . . . are arranged below the second wiring layer WL connected to the current driver DRV in a direction perpendicular to the second wiring layer WL. The wiring layers WL1, WL2, . . . are connected to the ground layer GND via the respective switches SW1, SW2, . . . each having the ON resistance. In this arrangement, a high-pass filter is formed by each of the parasitic capacitances C1, C2, . . . between the second wiring layer WL connected to the current driver DRV and each of the first wiring layers WL1, WL2, . . . , and the ON resistance of the MOSFET serving as each of the switches SW1, SW2, . . .

The ON resistance value is adjusted in accordance with the number of the ON switches SW1, SW2, . . . to arbitrarily set the characteristics of the high-pass filter. Thus, a rise/fall time can be controlled to obtain a desired output waveform.

Note that the number of sets of the first wiring layers WL1, WL2, . . . and the switches SW1, SW2, . . . connected to each other can be arbitrarily set. The larger the number of the sets becomes, the broader and finer the range of the ON resistance value of the high-pass filter can be set.

The plurality of switches SW1, SW2, . . . can be turned on/off in accordance with the control signals SW1, SW2, . . . respectively input from a switching control circuit SWC to the gate electrodes G1, G2, . . . of the MOSFETs.

The switching control circuit SWC may comprise, e.g., a fuse memory. In this case, the characteristics of a semiconductor device are inspected to determine which of the switches SW1, SW2, . . . is to be turned on. Data required to turn on/off the switches SW1, SW2, . . . are then written in the fuse memory. With this operation, the waveform can be controlled to cancel manufacturing process variation which influences the output waveform.

(3) Third Embodiment

Figure 6:
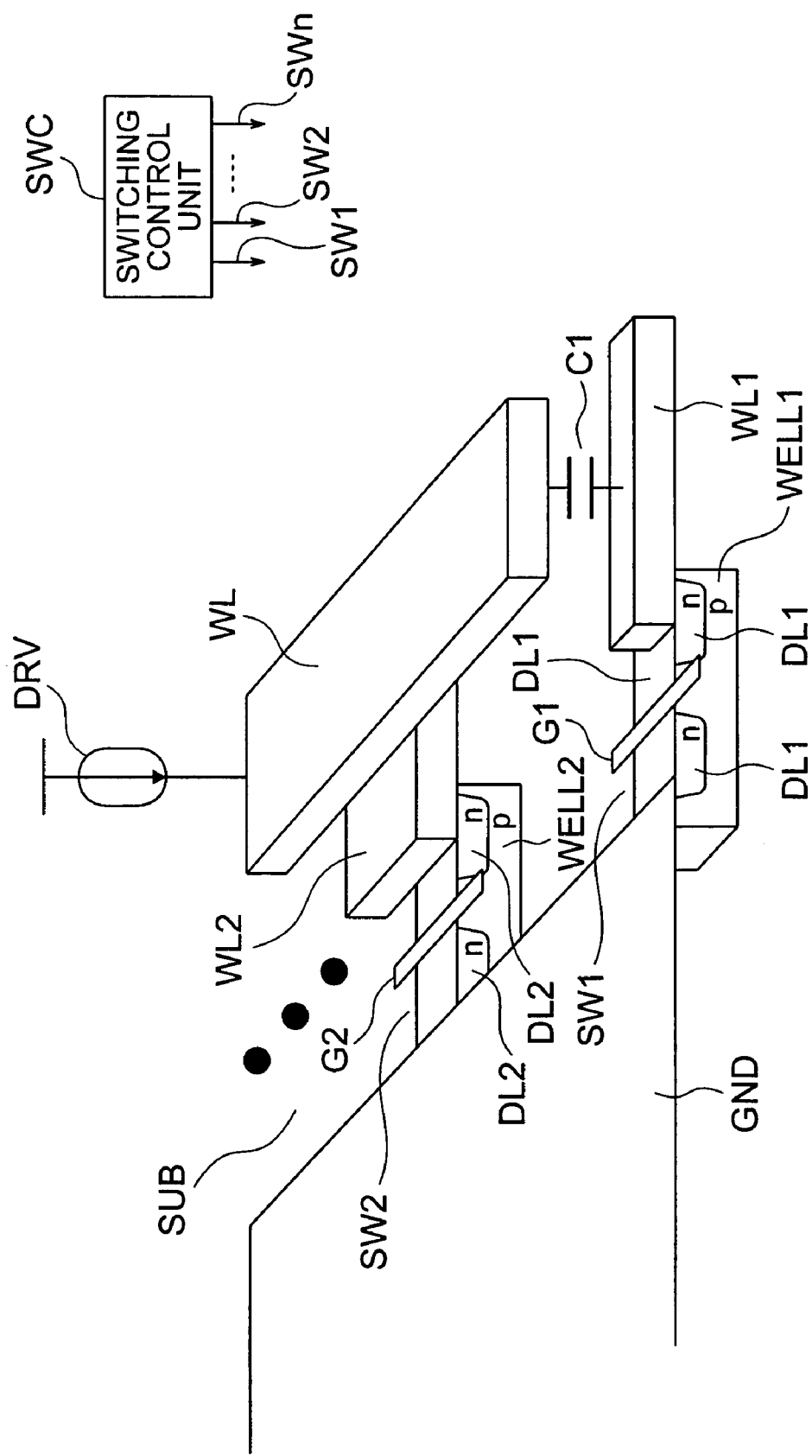
FIG. 6 is a perspective view showing the arrangement of a semiconductor device according to the third embodiment of the present invention.

The third embodiment of the present invention will be described with reference to FIG. 6 which shows its arrangement. In this case, an equivalent circuit is the same as that shown in FIG. 4 in the first and second embodiments.

In the second embodiment, the resistance of a high-pass filter is implemented by the ON resistance of a switch SW comprising a MOSFET. In contrast to this, in the third embodiment, the resistance of the high-pass filter is implemented by not only the ON resistance of the switch SW but also the wiring line resistance of each of the first wiring layers WL1, WL2, . . . connected to the ON resistance.

As in the second embodiment, a ground wiring line GND is formed on a semiconductor substrate SUB. A plurality of first wiring layers WL1, WL2, . . . are arranged at predetermined intervals in a direction perpendicular to one end face of the ground wiring line GND to oppose each other.

Note that the wiring layers WL1, WL2, . . . have different wiring line widths. For example, a wiring line width ratio may be sequentially set to be 1:2:4:8:16: . . . :$2^n$ (n is an integer equal to or more than 1).

Between the wiring layers WL1, WL2, . . . and the ground wiring line GND, switches SW1, SW2, . . . comprising MOSFETs are respectively provided. The switches SW1, SW2, . . . respectively include a plurality of wells WELL1, WELL2, . . . , gate electrodes G1, G2, . . . , and impurity diffusion layers DL1, DL2, . . . each serving as a source or drain. The switches SW1, SW2, . . . can be turned on/off in accordance with control signals SW1, SW2, . . . respectively input to the gate electrodes G1, G2, . . . in the MOSFETs. Of the plurality of switches SW1, SW2, . . . , at least one desired switch SWj is selectively turned on. Accordingly, a wiring layer WLj connected to the ON switch SWj is connected to a ground layer GND.

A second wiring layer WL whose longitudinal direction is perpendicular to the plurality of first wiring layers WL1, WL2, . . . is placed above them via an insulating layer (not shown). The wiring layer WL is connected to the output terminal of a current driver DRV.

In the third embodiment, the resistance value of the high-pass filter is adjusted by the ON resistance of one of the ON switches SW1, SW2, . . . , and the wiring resistance of one of the wiring lines WL1, WL2, . . . connected to the ON resistance. Upon arbitrarily setting the characteristics of the high-pass filter, a rise/fall time can be controlled to obtain a desired output waveform.

Furthermore, in the third embodiment, the widths of the first wiring lines WL1, WL2, . . . are set to arbitrary values. This makes it possible to set the wiring resistances to be different, and to weight the control coefficient for the resistance value of the high-pass filter, thereby controlling the rise/fall time to be an optimal value in more detail.

(4) Fourth Embodiment

Figure 7:
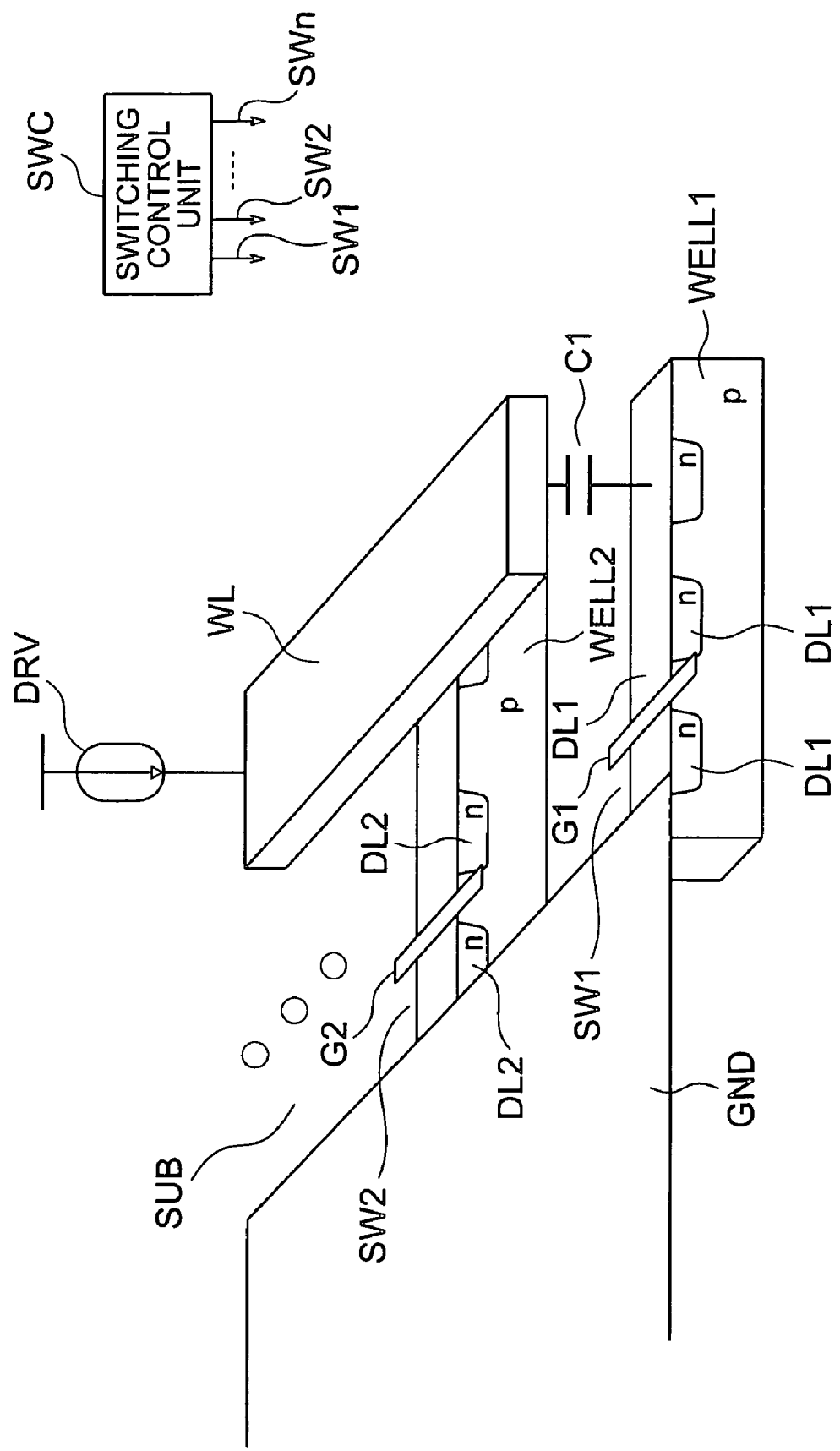
FIG. 7 is a perspective view showing the arrangement of a semiconductor device according to the fourth embodiment of the present invention.

FIG. 7 shows the arrangement of a semiconductor device according to the fourth embodiment of the present invention. In this case, an equivalent circuit is the same as that in the first to third embodiments shown in FIG. 4.

In the third embodiment, the resistance of a high-pass filter is implemented by the ON resistance of a selective ON switch SW comprising a MOSFET, and the wiring resistance of a first wiring layer WL connected to this ON resistance.

In contrast to this, in the fourth embodiment, the resistance of the high-pass filter is implemented by the ON resistance of the switch SW, and the resistance of each of the wells WELL1, WELL2, . . . having a predetermined impurity concentration in the upper surface portion of a semiconductor substrate SUB.

A ground wiring line GND is formed on the semiconductor substrate SUB. At a position opposing the one end face of the ground wiring line GND, the plurality of wells WELL1, WELL2, . . . which are formed in the semiconductor substrate SUB and electrically isolated from each other are arranged in a direction perpendicular to the first wiring layer WL, while one end portion of each of the wells WELL1, WELL2, . . . is electrically connected to the ground wiring line GND.

The wells WELL1, WELL2, . . . respectively include switches SW1, SW2, . . . comprising MOSFETs which have gate electrodes G1, G2, . . . and impurity diffusion layers DL1, DL2, . . . each serving as a source or drain. The switches SW1, SW2, . . . can be turned on/off in accordance with control signals SW1, SW2, . . . respectively input to the gate electrodes G1, G2, . . . in the MOSFETs. Of the plurality of switches SW1, SW2, . . . , at least one desired switch SWj is selectively turned on. Accordingly, a wiring layer WLj connected to the ON switch SWj is connected to a ground layer GND.

The first wiring layer WL whose longitudinal direction is perpendicular to the wells WELL1, WELL2, . . . is placed, via an insulating layer (not shown), above the semiconductor substrate SUB in which the wells WELL1, WELL2, . . . are formed. The first wiring layer WL is connected to the output terminal of a current driver DRV.

According to the fourth embodiment, the resistance value of the high-pass filter is adjusted in accordance with the number of ON switches SW1, SW2, . . . to arbitrarily set the characteristics of the high-pass filter. This makes it possible to obtain a desired value of the rise/fall time of the output waveform.

The widths or impurity concentrations of the wells WELL1, WELL2, . . . are arbitrarily set to weight the control coefficient for the resistance value of the high-pass filter.

Furthermore, the fourth embodiment can be implemented using a single-layer wiring arrangement. Note that the resistance value can be controlled by changing the widths of the wiring layers WL1, WL2, . . . in the third embodiment more easily than by changing the impurity concentrations of the wells WELL1, WELL2, . . . in the fourth embodiment.

(5) Fifth Embodiment

Figure 8:
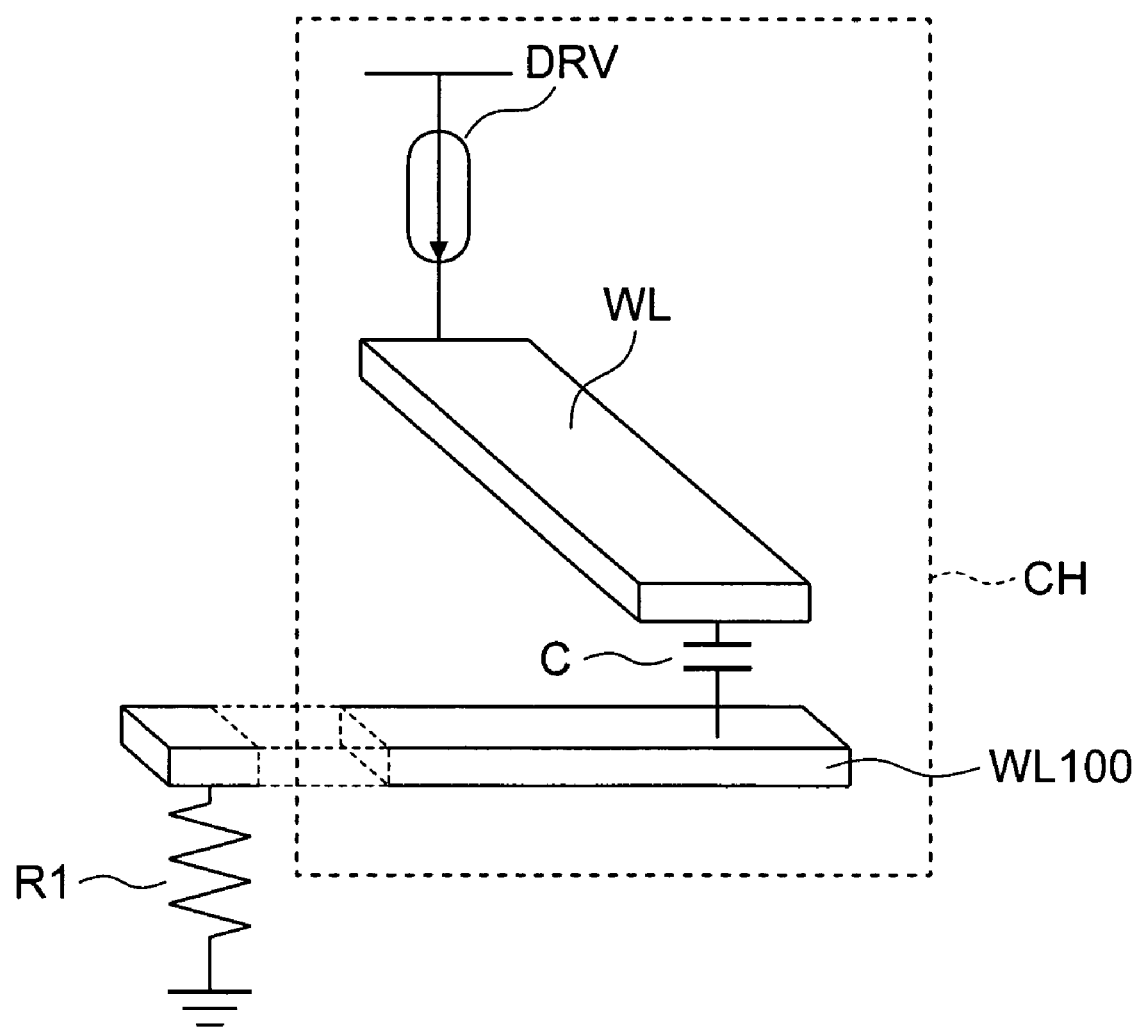
FIG. 8 is a perspective view showing the arrangement of a semiconductor device according to the fifth embodiment of the present invention.

FIG. 8 shows the arrangement of a semiconductor device according to the fifth embodiment of the present invention.

In the fifth embodiment, a semiconductor chip CH includes a current driver DRV, a second wiring layer WL connected to the output terminal of the current driver DRV, and a first wiring layer WL100 formed to oppose the second wiring layer WL via an insulating film (not shown). A parasitic capacitance C is formed between the wiring layer WL and the wiring layer WL100.

The wiring layer WL100 is extracted outside the semiconductor chip CH, and grounded via a resistance element R1 arranged outside the chip. More specifically, the wiring layer WL100 is connected to an external terminal (not shown) in the semiconductor chip CH, and an external resistance element R1 is connected between the external terminal and a ground terminal arranged outside the semiconductor chip CH.

A high-pass filter is formed by the parasitic capacitance C in the semiconductor chip CH and the external resistance element R1. The resistance value of this high-pass filter can be desirably set by replacing the resistance element R1.

As described above, according to the fifth embodiment, as in the first to fourth embodiments, the rise/fall time of an output waveform can be controlled to obtain a desired value by arbitrarily setting the characteristics of the high-pass filter.

In the fifth embodiment, one external terminal must be added. However, the resistance value of the high-pass filter can be easily controlled by replacing the external resistance element R1.

Note that the characteristics of the high-pass filter must be set based on a desired rise time $T_r$ of a signal. A frequency component $f_c$ of the rise time of the waveform is given by $$f_c = 0.35/T_r \qquad (1)$$

For example, when a rise time of 700 psec is to be implemented, the frequency component $f_c$ of this rise time is $$f_c = 0.35/700 \text{ (psec)} = 500 \text{ (MHz)} \qquad (2)$$

Accordingly, the high-pass filter for passing a frequency band of 500 MHz or more may be formed.

In the semiconductor device according to the above embodiments, the rise/fall time of the output waveform can be controlled to improve the waveform quality in high-speed signal transmission.

Each of the above embodiments is merely an example and hence does not limit the present invention, so each embodiment can be variously modified without departing from the technical scope of the present invention.

What is claimed is:

1. A semiconductor device comprising:
   a current driver which is connected to a power supply terminal, and supplies a predetermined current;
   a first wiring layer which is connected to an output terminal of said current driver; and
   a second wiring layer which is placed to oppose said first wiring layer via an insulating layer, and has a predetermined resistance value, wherein
   at least a part of said second wiring layer is grounded, a parasitic capacitance is formed between said first wiring layer and said second wiring layer, and
   a high-pass filter is formed by the capacitance and the predetermined resistance value of said second wiring layer.

2. A semiconductor device comprising:
   a current driver which is connected to a power supply terminal, and supplies a predetermined current;
   a first wiring layer which is connected to an output terminal of said current driver; and
   a second wiring layer which is placed to oppose said first wiring layer via an insulating layer, and has a predetermined resistance value,
   wherein said second wiring layer comprises a plurality of second wiring layers, and
   said device further includes a plurality of switch elements which are respectively arranged on said second wiring layers, and each of which has one terminal electrically connected to a corresponding one of said second wiring layers, and the other terminal grounded, and a switching control unit which controls an ON state of said switching element;
   wherein a high-pass filter is formed by an ON resistance of said switch element which is turned on by said switching control unit, and a parasitic capacitance formed between said ON second wiring layer and said first wiring layer corresponding to said ON switch element.

3. A device according to claim 2, wherein
   said second wiring layer is formed in a semiconductor substrate,
   said switch element is a MOSFET formed in an upper surface portion of the semiconductor substrate, and
   said other terminal of said switch element is connected to a ground wiring layer formed on the semiconductor substrate.

4. A device according to claim 2, wherein
   said switching control unit comprises a fuse memory, which stores data pertaining to on/off operations of said respective switch elements.

5. A device according to claim 3, wherein
   said switching control unit comprises a fuse memory, which stores data pertaining to on/off operations of said respective switch elements.

6. A semiconductor device comprising:
   a current driver which is connected to a power supply terminal, and supplies a predetermined current;
   a first wiring layer which is connected to an output terminal of said current driver; and
   a second wiring layer which is placed to oppose said first wiring layer via an insulating layer, and has a predetermined resistance value;
   wherein said second wiring layer comprises a plurality of second wiring layers, and
   said device further includes a plurality of switch elements which are respectively arranged on said second wiring layers, and each of which has one terminal electrically connected to a corresponding one of said second wiring layers, and the other terminal grounded, and a switching control unit which controls an ON state of said switching element, wherein
   said second wiring layers have different resistance values, and
   a high-pass filter is formed by an ON resistance of said switch element which is turned on by said switching control unit, the resistance value of said second wiring layer corresponding to said ON switch element, and a parasitic capacitance formed between said second wiring layer and said first wiring layer.

7. A device according to claim 6, wherein
   said second wiring layer is formed in a semiconductor substrate,
   said switch element is a MOSFET formed in an upper surface portion of the semiconductor substrate, and
   said other terminal of said switch element is connected to a ground wiring layer formed on the semiconductor substrate.

8. A device according to claim 6, wherein
   said switching control unit comprises a fuse memory, which stores data pertaining to on/off operations of said respective switch elements.

* * * * *